(12) United States Patent
Amikura et al.

(10) Patent No.: US 11,231,313 B2
(45) Date of Patent: Jan. 25, 2022

(54) METHOD OF OBTAINING OUTPUT FLOW RATE OF FLOW RATE CONTROLLER AND METHOD OF PROCESSING WORKPIECE

(71) Applicant: TOKYO ELECTRON LIMITED, Tokyo (JP)

(72) Inventors: Norihiko Amikura, Miyagi (JP); Risako Miyoshi, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 315 days.

(21) Appl. No.: 15/954,973

(22) Filed: Apr. 17, 2018

(65) Prior Publication Data

US 2018/0299908 A1 Oct. 18, 2018

(30) Foreign Application Priority Data

Apr. 18, 2017 (JP) .............................. JP2017-082022

(51) Int. Cl.
*G01F 25/00* (2006.01)
*G05D 7/06* (2006.01)
*H01L 21/67* (2006.01)
*G05D 7/01* (2006.01)

(52) U.S. Cl.
CPC ...... *G01F 25/0038* (2013.01); *G01F 25/0007* (2013.01); *G01F 25/0053* (2013.01); *G05D 7/0658* (2013.01); *H01L 21/67017* (2013.01); *H01L 21/67248* (2013.01); *G05D 7/0106* (2013.01); *H01L 21/67109* (2013.01); *H01L 21/67253* (2013.01)

(58) Field of Classification Search
CPC ............. G01F 25/0038; G01F 25/0053; Y10T 137/7759; Y10T 137/776

USPC .................................................. 137/486, 487
See application file for complete search history.

(56) References Cited

U.S. PATENT DOCUMENTS

| | | | | |
|---|---|---|---|---|
| 3,701,280 A | * | 10/1972 | Stroman | G01F 15/043 73/861.02 |
| 5,868,159 A | * | 2/1999 | Loan | G01F 1/88 137/334 |
| 6,074,691 A | * | 6/2000 | Schmitt | C23C 16/455 137/551 |

(Continued)

FOREIGN PATENT DOCUMENTS

| | | |
|---|---|---|
| JP | 2013-058066 A | 3/2013 |
| JP | 5530718 B2 | 6/2014 |

(Continued)

*Primary Examiner* — Robert K Arundale
*Assistant Examiner* — Richard K. Durden
(74) *Attorney, Agent, or Firm* — Studebaker & Brackett PC

(57) ABSTRACT

A method of obtaining the output flow rate of the flow rate controller according to an aspect is provided. The method including a first step of outputting gas whose flow rate is adjusted according to a designated set flow rate from the flow rate controller, in a state where the diaphragm mechanism is opened; a second step of adjusting the diaphragm mechanism so that the pressure in the second pipe is the target pressure value, in a state where the output of gas from the flow rate controller is continued in the first step; and a third step of obtaining the output flow rate of the flow rate controller by using a pressure value and a temperature value in the tank, after the pressure in the second pipe is set to the target pressure value in the second step.

9 Claims, 8 Drawing Sheets

(56) References Cited

U.S. PATENT DOCUMENTS

| | | | | |
|---|---|---|---|---|
| 6,631,334 B2* | 10/2003 | Grosshart | G05D 7/0635 | 118/726 |
| 7,412,986 B2* | 8/2008 | Tison | G01F 25/0038 | 137/12 |
| 7,424,895 B2* | 9/2008 | Tison | G01F 25/0038 | 137/12 |
| 7,461,549 B1* | 12/2008 | Ding | G01F 3/36 | 73/239 |
| 7,474,968 B2* | 1/2009 | Ding | G01F 25/0038 | 702/100 |
| 7,610,117 B2* | 10/2009 | Brodeur | G01F 1/363 | 137/487.5 |
| 7,716,993 B2* | 5/2010 | Ozawa | G01F 1/383 | 137/12 |
| 2002/0174899 A1* | 11/2002 | Adams | G05D 7/0635 | 137/487.5 |
| 2004/0261492 A1* | 12/2004 | Zarkar | G01F 25/0053 | 73/1.34 |
| 2005/0067021 A1* | 3/2005 | Bevers | G05D 7/0658 | 137/487.5 |
| 2006/0212233 A1* | 9/2006 | Wong | G01F 25/0038 | 702/50 |
| 2006/0217903 A1* | 9/2006 | Shajii | G01F 25/0053 | 702/47 |
| 2006/0236781 A1* | 10/2006 | Ohmi | G01F 1/42 | 73/861.52 |
| 2009/0112504 A1* | 4/2009 | Ding | G01F 22/02 | 702/100 |
| 2009/0146089 A1* | 6/2009 | Moriya | G05D 7/0635 | 251/12 |
| 2014/0158211 A1* | 6/2014 | Ding | G01F 15/005 | 137/10 |
| 2018/0188700 A1* | 7/2018 | Penley | G01F 25/0053 | |

FOREIGN PATENT DOCUMENTS

| | | |
|---|---|---|
| JP | 2017-059199 A | 3/2017 |
| WO | 2008/064044 A1 | 5/2008 |

* cited by examiner

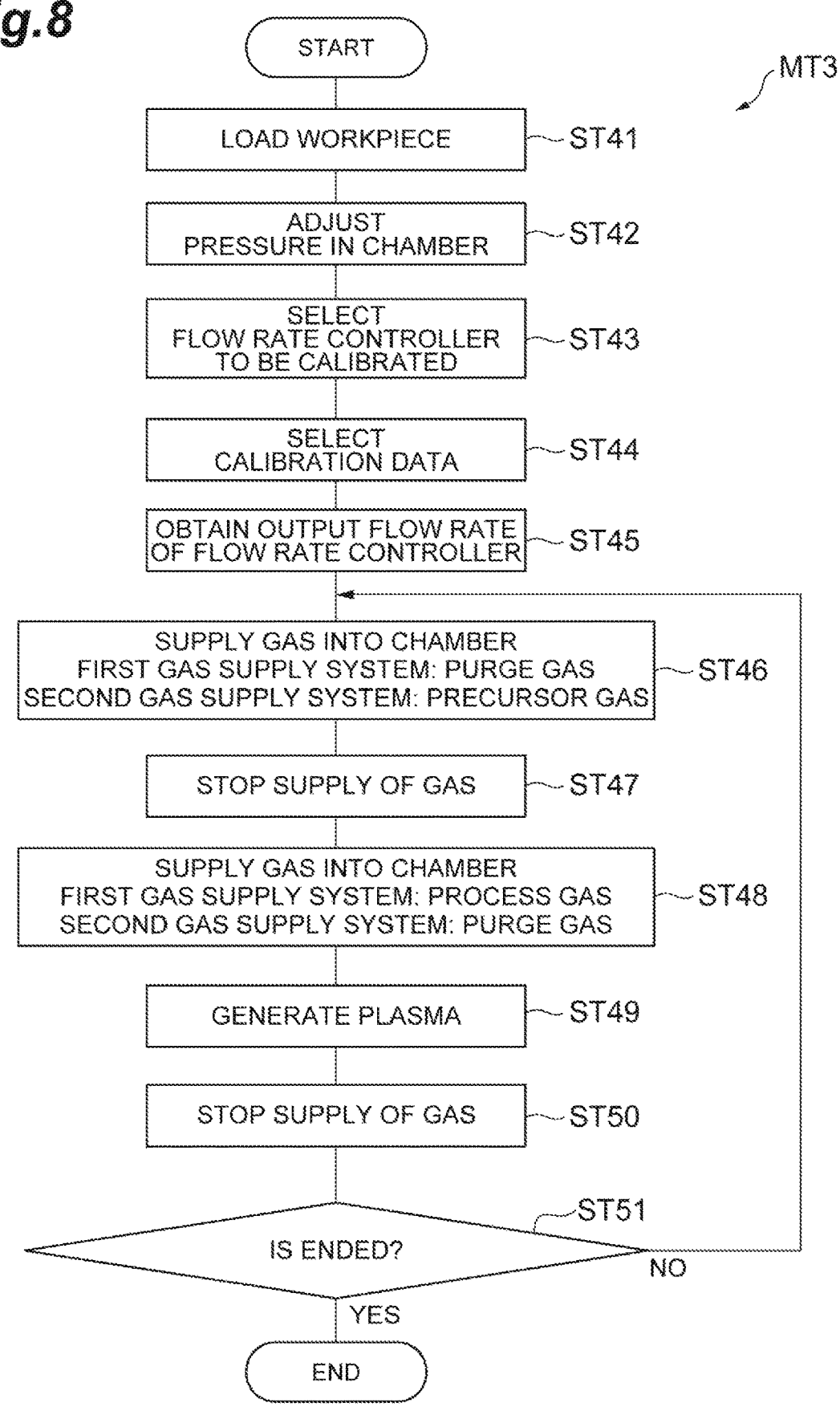

METHOD OF OBTAINING OUTPUT FLOW RATE OF FLOW RATE CONTROLLER AND METHOD OF PROCESSING WORKPIECE

CROSS-REFERENCE TO RELATED APPLICATIONS

This application is based on and claims the benefit of priority from Japanese Patent Application No. 2017-082022 filed on Apr. 18, 2017, the entire contents of which are incorporated herein by reference.

FIELD

Exemplary Embodiments of the present disclosure relate to a method of obtaining an output flow rate of a flow rate controller and a method of processing a workpiece.

BACKGROUND

In the manufacture of electronic devices such as semiconductor devices, a substrate processing apparatus is used. In a chamber of the substrate processing apparatus, gas for processing a substrate is supplied from a gas supply unit. The gas supply unit includes a flow rate controller which adjusts the flow rate of the gas.

The flow rate controller operates to reduce the difference between the set flow rate which is the target value and the calculation flow rate which is obtained from the pressure value or the temperature value measured in the flow rate controller. The calculation flow rate of the flow rate controller is calibrated so as to coincide with the output flow rate which is actually output from the flow rate controller. However, in the calculation flow rate of the flow rate controller, a large error may occur with respect to the output flow rate of the flow rate controller. For example, as the use time of the flow rate controller elapses, in the calculated flow rate of the flow rate controller, an error may occur with respect to the output flow rate of the flow rate controller. Therefore, it is necessary to obtain the output flow rate of the flow rate controller.

As a method of obtaining the output flow rate of the flow rate controller, for example, a method disclosed in Japanese Patent No. 5530718 is known. In this method, an orifice is provided between a flow rate controller and a chamber, and the pressure value on the upstream side of the orifice is measured at a state where gas is output from the orifice at the speed of sound. Then, the flow rate of the gas supplied into the chamber through the flow rate controller is calculated from the measured pressure value.

SUMMARY

In an aspect, a method of obtaining an output flow rate of a flow rate controller of a gas supply unit is provided. The gas supply unit includes a first pipe connected to a gas source, a flow rate controller provided downstream of the first pipe, and a second pipe provided downstream of the flow rate controller. A diaphragm mechanism capable of adjusting a pressure in the second pipe is provided downstream of the second pipe, and a tank is provided downstream of the diaphragm mechanism. The method includes a first step of outputting gas whose flow rate is adjusted according to a designated set flow rate from the flow rate controller, in a state where the diaphragm mechanism is opened; a second step of adjusting the diaphragm mechanism so that the pressure in the second pipe is the target pressure value, in a state where the output of gas from the flow rate controller is continued in the first step; and a third step of obtaining the output flow rate of the flow rate controller by using a pressure value and a temperature value in the tank, after the pressure in the second pipe is set to the target pressure value in the second step.

In another aspect, there is provided a method of processing a workpiece by using a substrate processing apparatus. The substrate processing apparatus includes a chamber body providing a chamber, a stage supporting the workpiece in the chamber, a gas supply unit that supplies gas into the chamber, the gas supply unit including a first pipe connected to a gas source, a flow rate controller provided downstream of the first pipe, and a second pipe which is provided downstream of the flow rate controller and connected to the chamber, an exhaust device connected to the chamber, and a pressure regulating valve provided between the chamber body and the exhaust device. The method includes a first step of setting a pressure in the chamber to a designated set pressure by the pressure regulating valve; a second step of obtaining the output flow rate of the flow rate controller according to a pressure value in the second pipe based on calibration data for defining a relationship between a plurality of pressure values and the output flow rate of the flow rate controller; a third step of controlling a control valve of the flow rate controller so that an error of the output flow rate obtained in the second step for a designated set flow rate decreases; and a fourth step of processing the workpiece in the chamber, using gas output from the flow rate controller in the third step.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIG. 8 is a flow diagram illustrating a method of processing a workpiece according to an exemplary embodiment.

DETAILED DESCRIPTION

Figure 1:
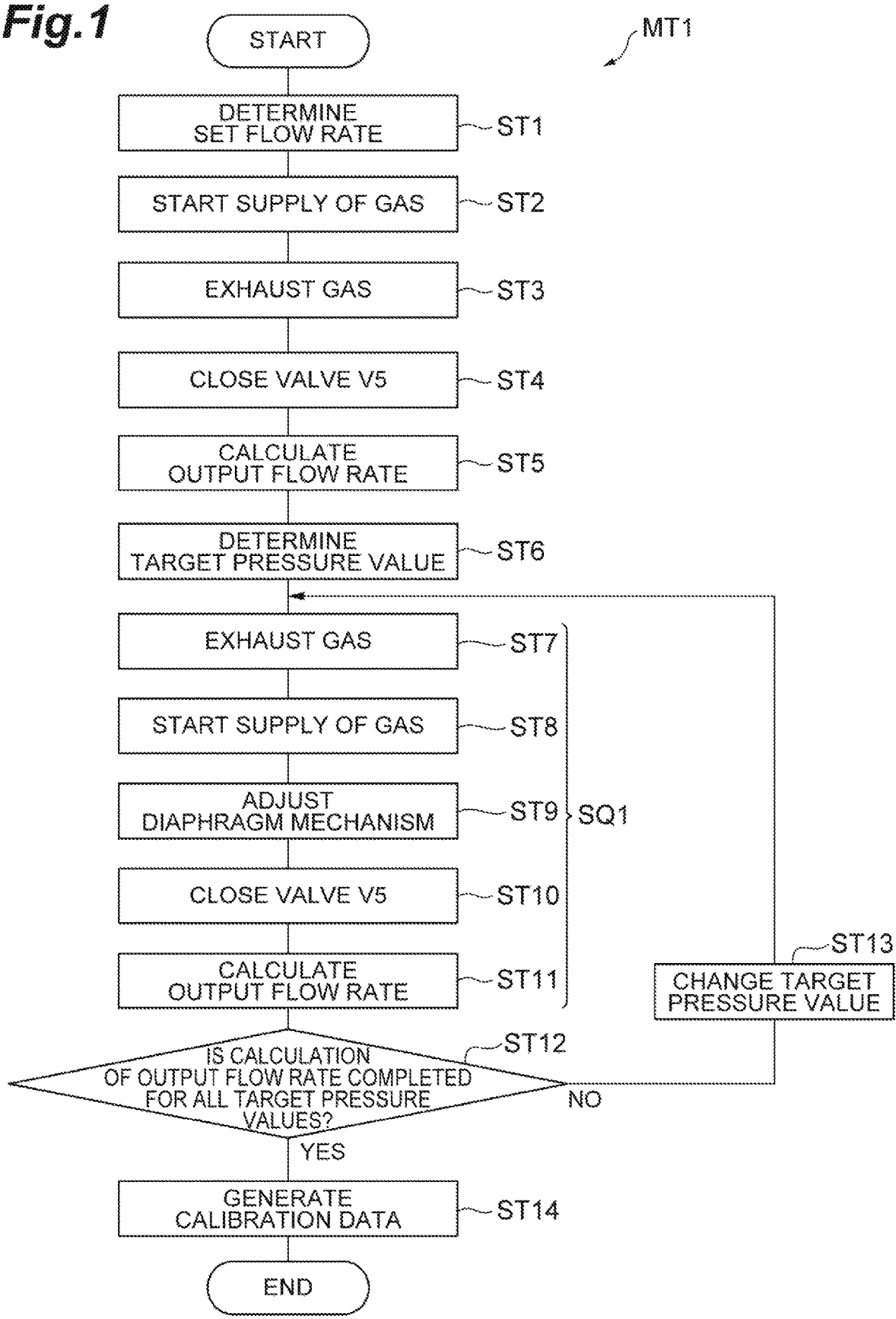
FIG. 1 is a flow diagram illustrating a method of obtaining an output flow rate of a flow rate controller according to an exemplary embodiment.

In the following detailed description, reference is made to the accompanying drawings, which form a part hereof. The exemplary embodiments described in the detailed description, drawing, and claims are not meant to be limiting. Other exemplary embodiments may be utilized, and other changes may be made, without departing from the spirit or scope of the subject matter presented here.

The method described in Japanese Patent No. 5530718 is a method of obtaining the output flow rate of the flow rate controller under the condition that gas is output from the orifice at the speed of sound, and it is difficult to calculate the output flow rate of the flow rate controller with high accuracy under such an environment where such a condition is not satisfied.

Therefore, in this technical field, a method which can obtain the output flow rate of gas of the flow rate controller with high precision is required.

In an aspect, a method of obtaining an output flow rate of a flow rate controller of a gas supply unit is provided. The gas supply unit includes a first pipe connected to a gas source, a flow rate controller provided downstream of the first pipe, and a second pipe provided downstream of the flow rate controller. A diaphragm mechanism capable of adjusting a pressure in the second pipe is provided downstream of the second pipe, and a tank is provided downstream of the diaphragm mechanism. The method includes a first step of outputting gas whose flow rate is adjusted according to a designated set flow rate from the flow rate controller, in a state where the diaphragm mechanism is opened; a second step of adjusting the diaphragm mechanism so that the pressure in the second pipe is the target pressure value, in a state where the output of gas from the flow rate controller is continued in the first step; and a third step of obtaining the output flow rate of the flow rate controller by using a pressure value and a temperature value in the tank, after the pressure in the second pipe is set to the target pressure value in the second step.

The present inventors have found that the output flow rate (hereinafter also referred to as "actual flow rate") of gas actually output from the flow rate controller depends on the pressure on the downstream side of the flow rate controller, that is, the pressure (pressure on the secondary side) of the second pipe. Therefore, in the method in the related art of calculating the output flow rate of the flow rate controller using only the pressure value on the upstream side of the flow rate controller, a large difference occurs between the calculation flow rate of the flow rate controller and the actual flow rate. In the method according to the aspect, after adjusting the diaphragm mechanism so that the pressure in the second pipe is the target pressure value, the output flow rate of the flow rate controller is calculated based on the pressure value and temperature value in the tank, such that it is possible to recognize the output flow rate of the flow rate controller according to the pressure on the secondary side of the flow rate controller. Therefore, the output flow rate of gas of the flow rate controller can be obtained with high accuracy.

In the method according to an exemplary embodiment, a valve is provided downstream of the tank, in the first step, in a state where the diaphragm mechanism and the valve are opened, the gas whose flow rate is adjusted according to the designated set flow rate is output from the flow rate controller, and in the third step, the valve is closed after the pressure in the second pipe is set to the target pressure value, and after the valve is closed, the output flow rate of the flow rate controller may be obtained from a known volume of a flow path including the tank in which gas supplied through the flow rate controller is stored, a temperature value in the tank and a rise amount of a pressure value in the tank per unit time.

In an exemplary embodiment, the internal space of the tank includes a first space and a second space provided downstream of the first space, and the first space and the second space are connected to each other through an orifice such that a pressure in the first space is twice or more a pressure in the second space, and in the third step, an output flow rate of the flow rate controller may be obtained from a pressure value and a temperature value in the first space.

In an exemplary embodiment, calibration data for defining a relationship between a plurality of pressure values and the output flow rate of the flow rate controller may be obtained by repeatedly executing a sequence including the first step, the second step, and the third step, while changing the target pressure value to the plurality of pressure values different from each other.

In another aspect, there is provided a method of processing a workpiece by using a substrate processing apparatus. The substrate processing apparatus includes a chamber body providing a chamber, a stage supporting the workpiece in the chamber, a gas supply unit that supplies gas into the chamber, the gas supply unit including a first pipe connected to a gas source, a flow rate controller provided downstream of the first pipe, and a second pipe which is provided downstream of the flow rate controller and connected to the chamber, an exhaust device connected to the chamber, and a pressure regulating valve provided between the chamber body and the exhaust device. The method includes a first step of setting a pressure in the chamber to a designated set pressure by the pressure regulating valve; a second step of obtaining the output flow rate of the flow rate controller according to a pressure value in the second pipe based on calibration data for defining a relationship between a plurality of pressure values and the output flow rate of the flow rate controller; a third step of controlling a control valve of the flow rate controller so that an error of the output flow rate obtained in the second step for a designated set flow rate decreases; and a fourth step of processing the workpiece in the chamber, using gas output from the flow rate controller in the third step.

In the method according to the above aspect, the output flow rate of the flow rate controller is obtained based on the calibration data corresponding to the pressure value in the second pipe. Since the output flow rate obtained in this way is a flow rate calculated considering the downstream pressure of the flow rate controller, the error rate with respect to the actual output flow rate of the flow rate controller is small. Therefore, by controlling the flow rate controller so that the difference between the output flow rate calculated in this way and the set flow rate is reduced, the difference between the flow rate of gas actually output from the flow rate controller and the set flow rate can be reduced.

In an exemplary embodiment, a diaphragm mechanism capable of adjusting a pressure in the second pipe is provided downstream of the second pipe, a tank is provided downstream of the diaphragm mechanism, and the calibration data may be obtained by repeatedly executing a sequence including a fifth step of outputting gas whose flow rate is adjusted according to a designated set flow rate from the flow rate controller, in a state where the diaphragm mechanism is opened, a sixth step of adjusting the diaphragm mechanism so that the pressure in the second pipe is a target pressure value, in a state where the output of gas from the flow rate controller is continued in the fifth step, and a seventh step of obtaining the output flow rate of the flow rate controller by using a pressure value and a temperature value in the tank, after the pressure in the second pipe is set to the target pressure value in the sixth step.

In an exemplary embodiment, the flow rate controller may be a pressure type flow rate controller. In an exemplary embodiment, the flow rate controller may be a thermal type mass flow rate controller. In an exemplary embodiment, a gas supply system including the gas supply unit may further include another gas supply unit, the other gas supply unit includes another first pipe connected to another gas source, another flow rate controller provided downstream of the other first pipe, and another second pipe provided downstream of the other flow rate controller, and the diaphragm mechanism is provided downstream of the second pipe and the other second pipe.

In an exemplary embodiment, in the second step, the diaphragm mechanism may be adjusted so that the pressure in the second pipe is one pressure value as the target pressure value, in the third step, the output flow rate of the flow rate controller is obtained by using a pressure value and a temperature value in the tank, after the pressure in the second pipe is set to the one pressure value in the second step, and the method further comprises obtaining calibration data for defining a relationship between the one pressure value and the output flow rate of the flow rate controller obtained in the third step.

In an exemplary embodiment, the tank may comprise a pressure gauge measuring pressure inside of the tank and a thermometer measuring temperature inside of the tank. In an exemplary embodiment, an exhaust device may be provided downstream of the tank via the valve.

In an exemplary embodiment, A method of obtaining an output flow rate of a flow rate controller of a gas supply unit, wherein the gas supply unit includes a first pipe connected to a gas source, a flow rate controller provided downstream of the first pipe, and a second pipe provided downstream of the flow rate controller, wherein a valve capable of adjusting a pressure in the second pipe is provided downstream of the second pipe, and wherein a processing space is provided downstream of the valve, the method comprising: a first step of outputting gas whose flow rate is adjusted according to a designated set flow rate from the flow rate controller, in a state where the valve is opened; a second step of adjusting the valve so that the pressure in the second pipe is a target pressure value, in a state where the output of gas from the flow rate controller is continued in the first step; and a third step of obtaining the output flow rate of the flow rate controller by using a pressure value and a temperature value in the processing space, after the pressure in the second pipe is set to the target pressure value in the second step.

According to the aspects and various exemplary embodiments of the present invention, the output flow rate of gas of the flow rate controller can be obtained with high accuracy.

Hereinafter, various exemplary embodiments will be described in detail with reference to the accompanying drawings. In the drawings, the same or corresponding parts are denoted by the same reference numerals, and duplicate descriptions for the same or corresponding parts are omitted. Further, the dimensional ratio of each drawing does not always match the actual dimensional ratio.

FIG. 1 is a flow diagram illustrating a method of obtaining an output flow rate of a flow rate controller according to an exemplary embodiment. This method can be applied to the substrate processing apparatus including a gas supply unit. The substrate processing apparatus may be any substrate processing apparatus, and may be, for example, a plasma processing apparatus.

Figure 2:
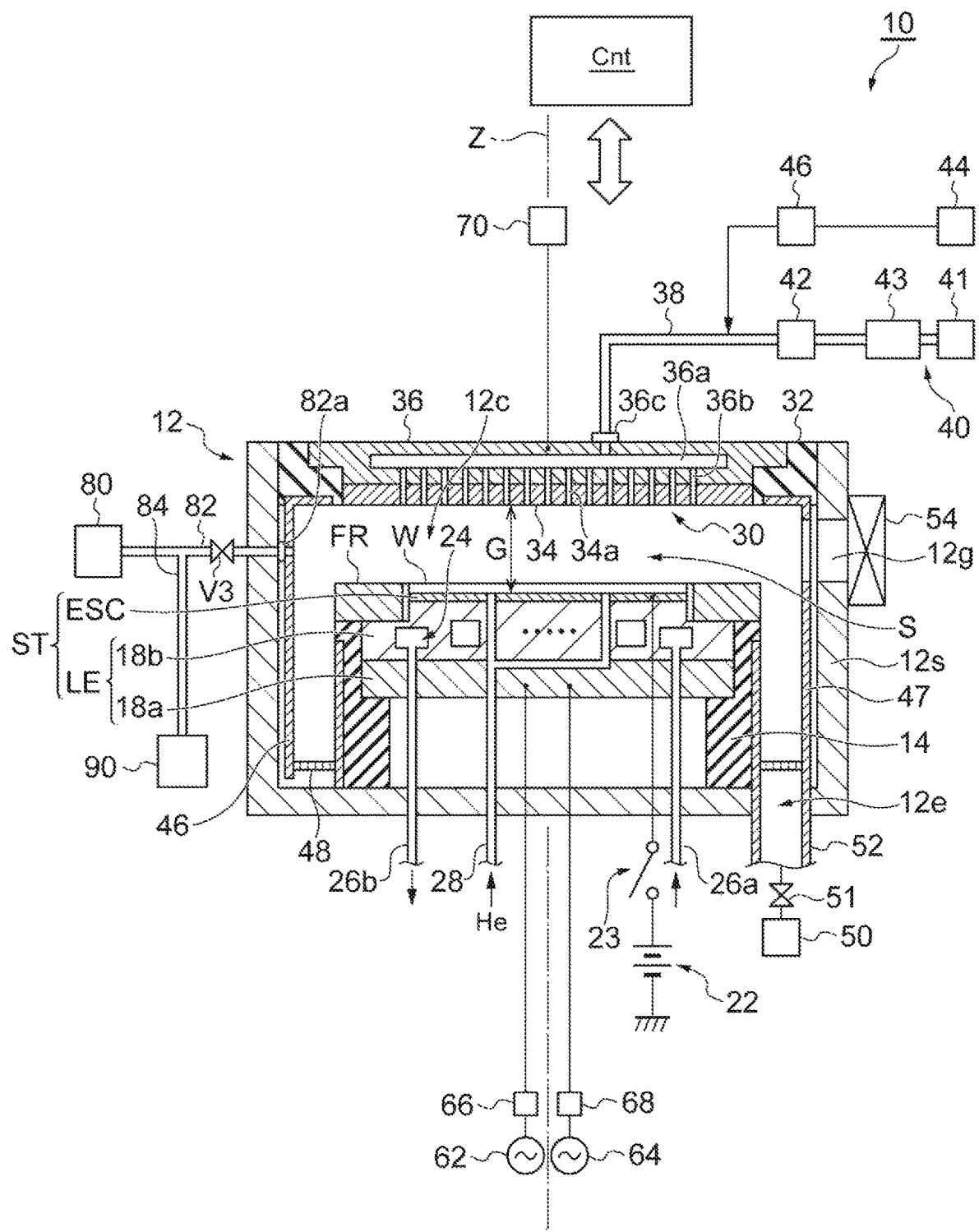
FIG. 2 is a vertical cross-sectional view schematically illustrating a substrate processing apparatus according to an exemplary embodiment.

FIG. 2 is a diagram schematically illustrating an example of the substrate processing apparatus to which the method illustrated in FIG. 1 can be applied. The substrate processing apparatus 10 illustrated in FIG. 2 includes a chamber body 12. The chamber body 12 includes a side wall 12s. The side wall 12s has a substantially cylindrical shape centered on the axis line Z. A bottom wall is provided at the lower end of the side wall 12s. The chamber body 12 provides the internal space as a chamber 12c. The inner wall surface of the chamber body 12 is made of aluminum subjected to, for example, anodic oxidation treatment.

A substantially cylindrical support portion 14 is provided on the bottom wall of the chamber body 12. The support portion 14 is made of, for example, an insulating material. The support portion 14 extend in a direction parallel to the axis line Z from the bottom wall of the chamber body 12, inside the chamber body 12. The stage ST is supported by the support portion 14.

The stage ST supports a workpiece (hereinafter referred to as "wafer W") on the upper surface. The stage ST has a lower electrode LE and an electrostatic chuck ESC. The lower electrode LE includes a first plate 18a and a second plate 18b. The first plate 18a and the second plate 18b are made of, for example, metal such as aluminum, and have a substantially disc shape. The second plate 18b is supported by the first plate 18a such that it is electrically connected to the first plate 18a.

On the second plate 18b, an electrostatic chuck ESC is supported. The electrostatic chuck ESC has a structure in which an electrode which is a conductive film is disposed between a pair of insulating layers or insulating sheets. A DC power supply 22 is electrically connected to the electrode of the electrostatic chuck ESC through a switch 23. The electrostatic chuck ESC attracts the wafer W by an electrostatic force such as a Coulomb force generated by a DC voltage from the DC power supply 22. Thus, the electrostatic chuck ESC can hold the wafer W.

A focus ring FR is provided on the peripheral portion of the second plate 18b. The focus ring FR extends annularly so as to surround the wafer W and the electrostatic chuck ESC. The focus ring FR is for improving the uniformity of the etching and is made of a material selected according to the material of a film to be etched, for example, silicon or quartz.

Inside the second plate 18b, a coolant flow path 24 functioning as a temperature control mechanism is provided. Coolant is supplied to the coolant flow path 24 from a chiller unit provided outside the chamber body 12 through a pipe 26a, and the coolant supplied to the coolant flow path 24 is returned to the chiller unit through the pipe 26b. That is, the coolant is supplied to the coolant flow path 24 so as to circulate. By adjusting the temperature of the coolant supplied to the coolant flow path 24 by the chiller unit, the temperature of the wafer W supported on the electrostatic chuck ESC is controlled.

Further, the substrate processing apparatus 10 includes a deposit shield 47. The deposit shield 47 is provided along the inner wall of the chamber body 12 and the outer circumference of the support portion 14. The deposit shield 47 is made by coating aluminum with ceramics such as $Y_2O_3$, and prevents byproducts generated by etching from adhering to the chamber body 12.

A gas supply line 28 is formed in the stage ST. The gas supply line 28 extends through the stage ST from the outside of the chamber body 12 in the thickness direction, and heat transfer gas, for example, helium (He) gas from the heat transfer gas supply mechanism is supplied to between the upper surface of the electrostatic chuck ESC and the back surface of wafer W.

A baffle plate 48 is provided between the stage ST and the side wall 12s of the chamber body 12. The baffle plate 48 can be made, for example, by covering an aluminum material with ceramics such as yttrium oxide. A plurality of through holes is formed on the baffle plate 48.

An exhaust port 12e is provided in the chamber body 12 below the baffle plate 48. An exhaust device 50 is connected to the exhaust port 12e through an exhaust pipe 52. A pressure regulating valve 51 is provided between the exhaust device 50 and the exhaust port 12e. The exhaust device 50 includes a vacuum pump such as a turbo molecular pump, and can depressurize the pressure in the chamber 12c to a degree of vacuum corresponding to the opening degree of the pressure regulating valve 51.

In addition, a loading and unloading port 12g for a wafer W is provided in the side wall of the chamber body 12. The loading and unloading port 12g can be opened and closed by the gate valve 54.

The substrate processing apparatus 10 further includes a upper electrode 30. The upper electrode 30 is disposed so as to face the stage ST, above the stage ST. The lower electrode LE and the upper electrode 30 are provided substantially parallel to each other. Between the upper electrode 30 and the lower electrode LE, a processing space S for performing plasma processing on the wafer W is provided.

The upper electrode 30 is supported on the upper part of the chamber body 12 through an insulating shielding member 32. The upper electrode 30 can be configured such that a distance G can be changed along the axis line Z direction from the upper surface of the stage ST. The upper electrode 30 includes an electrode plate 34 and an electrode support 36. The electrode plate 34 is exposed in the processing space S. A plurality of gas discharge holes 34a is formed on the electrode plate 34. The electrode plate 34 is made of, for example, silicon. In the exemplary embodiment illustrated in FIG. 1, although the electrode plate 34 has a flat plate shape, in an exemplary embodiment, the electrode plate 34 may have a tapered shape in which the distance G between the upper electrode 30 and the upper surface of the stage ST becomes shorter along the outer circumference.

The electrode support 36 detachably supports the electrode plate 34, and can be made of a conductive material such as aluminum, for example. The electrode support 36 may have a water cooling structure. Inside the electrode support 36, a gas diffusion chamber 36a is provided. In the gas diffusion chamber 36a, a plurality of gas flow holes 36b extends downward so as to respectively communicate with the plurality of gas discharge holes 34a. A gas inlet 36c for guiding the processing gas to the gas diffusion chamber 36a is formed in the electrode support 36. The gas inlet 36c is connected to a gas supply pipe 38.

A first gas supply system 40 is provided in the gas supply pipe 38. The first gas supply system 40 supplies process gas for processing wafer W in the chamber, and includes a gas source group 41, a valve group 42, and a flow rate controller group 43. The gas source group 41 has a plurality of gas sources. Examples of these plurality of gas sources include gas sources of oxygen-containing gas, nitrogen-containing gas and etching gas. Examples of the oxygen-containing gas include oxygen ($O_2$) gas, ozone ($O_3$) gas, carbon monoxide (CO) gas, and carbon dioxide ($CO_2$) gas. Examples of the nitrogen-containing gas include nitrogen ($N_2$) gas and ammonia ($NH_3$) gas. Examples of the etching gas include fluorocarbon gases such as $C_4F_6$ gas and $C_4F_8$ gas.

A flow rate controller group 43 is provided downstream of the gas source group 41. The flow rate controller group 43 includes a plurality of flow rate controllers. The plurality of flow rate controllers is, for example, a pressure control type flow rate controller (FCS) or a mass flow controller, and is connected to a plurality of gas sources in the gas source group 41, respectively. A valve group 42 is provided downstream of the flow rate controller group 43. The valve group 42 includes a plurality of valves respectively connected to a plurality of flow rate controllers in the flow rate controller group 43. The process gas from the gas source group 41 is supplied to the processing space S through the flow rate controller group 43, the valve group 42, the gas supply pipe 38, the gas diffusion chamber 36a, the plurality of gas flow holes 36b, and the plurality of gas discharge holes 34a.

Further, the first gas supply system 40 further includes a gas source 44 and a valve 46. The gas source 44 is the gas source of purge gas. As the purge gas, rare gas or inert gas such as $N_2$ gas is used. Examples of the rare gas include argon (Ar) gas, He gas, krypton (Kr) gas, and xenon (Xe) gas. The purge gas from the gas source 44 is supplied into the processing space S through the valve 46, the gas supply pipe 38, the gas diffusion chamber 36a, the plurality of gas flow holes 36b, and the plurality of gas discharge holes 34a.

A gas inlet 82a is formed in the side wall 12s of the chamber body 12. A gas supply pipe 82 is connected to the gas inlet 82a. The gas inlet 82a is provided between the stage ST and the upper electrode 30 in the axis line Z direction, and guides the gas from the gas supply pipe 82 to the processing space S. A third valve V3 is provided in the gas supply pipe 82. A second gas supply system 80 is connected upstream of the third valve V3 of the gas supply pipe 82. A pipe 84 is connected to the position between the second gas supply system 80 of the gas supply pipe 82 and the third valve V3. A gas flow rate measurement mechanism 90 is connected to the pipe 84.

Figure 3:
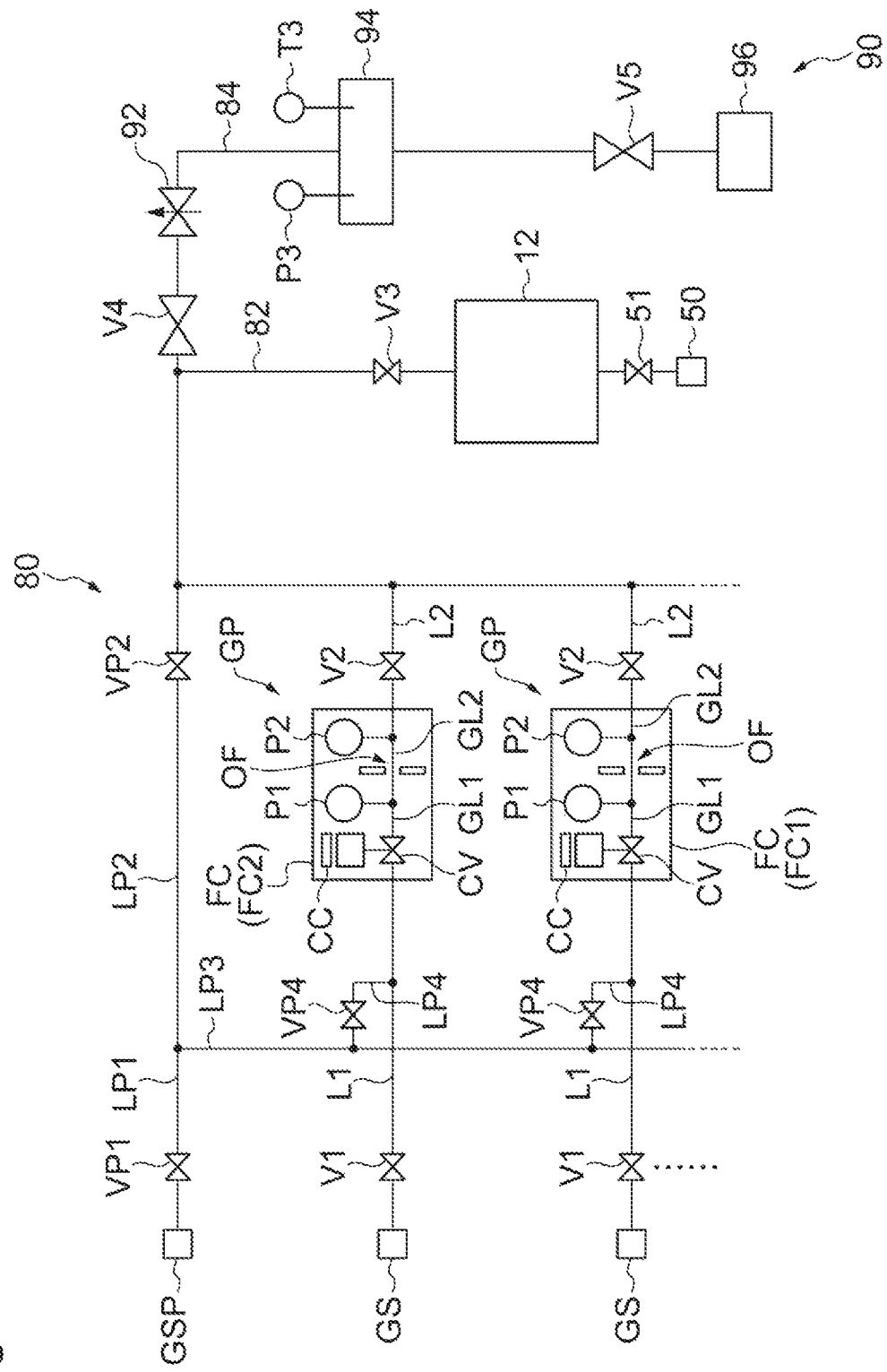
FIG. 3 is a diagram illustrating an example of a second gas supply system and a gas flow rate measurement mechanism.

Hereinafter, the second gas supply system 80 and the gas flow rate measurement mechanism 90 will be described in detail with reference to FIG. 3. The second gas supply system 80 supplies a film forming material (precursor) gas for forming a film on the wafer W to the processing space S. As shown in FIG. 3, the second gas supply system 80 includes a plurality of first pipe L1, a plurality of first valves V1, a plurality of flow rate controllers FC, a plurality of second pipe L2, and a plurality of second valves V2. Each of the plurality of flow rate controllers FC together with the first pipe L1 located upstream of the flow rate controller FC and the second pipe L2 located downstream thereof constitute a gas supply unit GP. That is, the second gas supply system 80 includes a plurality of gas supply units GP.

One end of the plurality of first pipe L1 is connected to the plurality of gas sources GS. The plurality of gas sources GS is a precursor gas source. The precursor gas is, for example, silicon-containing gas. As the silicon-containing gas, aminosilane-based gas such as bis-tertiary butyl aminosilane (BTBAS), bisdimethylaminosilane (BDMAS), bisdiethylaminosilane (BDEAS), dimethylaminosilane (DMAS), diethylaminosilane (DEAS), dipropylaminosilane (DPAS), butylaminosilane (BAS), diisopropylaminosilane (DIPAS), and bisethylmethylaminosilane (BEMAS), silicon alkoxide gas such as tetraethoxysilane (TEOS), and silicon halide gas such as $SiCl_4$ and $SiF_4$ are exemplified.

A plurality of first valves V1 is provided in the plurality of first pipe L1, respectively. A plurality of flow rate controllers FC is provided downstream of the plurality of first pipe L1. The plurality of flow rate controllers FC is connected to the other end on the downstream side of a plurality of first pipe L1. A plurality of second pipe L2 is provided downstream of the plurality of flow rate controllers FC. One end of the plurality of second pipe L2 is connected to the plurality of flow rate controllers FC, respectively. A plurality of second valves V2 are provided in the plurality of second pipe L2, respectively.

A gas supply pipe 82 is connected to the other end on the downstream side of the plurality of second pipe L2. The third valve V3 is provided in the gas supply pipe 82. The other end of the gas supply pipe 82, that is, the end of the gas supply pipe 82 downstream of the third valve V3 is connected to the chamber body 12 of the substrate processing apparatus 10. Therefore, the plurality of second pipe L2 is connected to the chamber body 12 through the gas supply pipe 82.

The second gas supply system 80 further includes a pipe LP1, a valve VP1, a pipe LP2, a valve VP2, a pipe LP3, a plurality of pipe LP4, and a plurality of valves VP4. One end of the pipe LP1 is connected to gas source GSP of purge gas such as $N_2$ gas or rare gas. A valve VP1 is provided in the pipe LP1. The pipe LP1 is connected to the pipe LP2 and the pipe LP3 downstream of the valve VP1. One end of the pipe LP2 is connected to the pipe LP1 downstream of the valve VP1, and the other end of the pipe LP2 is connected to the gas supply pipe 82. A valve VP2 is provided in the pipe LP2. One end of the pipe LP3 is connected to the pipe LP1 downstream of the valve VP1. One end of the plurality of pipe LP4 is connected to the pipe LP3. The other end of the plurality of pipe LP4 is connected to the plurality of first pipe L1 downstream of a plurality of first valves V1. A plurality of valves VP4 are respectively provided in the pipe LP4.

The plurality of flow rate controllers FC is, for example, a pressure control type flow rate controller. In an exemplary embodiment, the plurality of flow rate controllers FC includes a flow rate controller FC1 and a flow rate controller FC2. Each of the plurality of flow rate controllers FC includes a control valve CV, an orifice OF, a pressure gauge P1, a pressure gauge P2, and a control circuit CC. Further, each of the plurality of flow rate controllers FC provides a gas line GL1 on the upstream side of the orifice OF and a gas line GL2 on the downstream side of the orifice OF. The gas line GL1 is connected to the corresponding first pipe L1, and the gas line GL2 is connected to the corresponding second pipe L2.

The control valve CV is provided in the gas line GL1 on the upstream side of the orifice OF. Between the control valve CV and the orifice OF, a pressure gauge P1 that measures the pressure of the gas line GL1 is connected to the gas line GL1. A pressure gauge P2 that measures the pressure of the gas line GL2 is connected to the gas line GL2.

The control circuit CC of the flow rate controller FC calculates the flow rate of the gas to be output from the flow rate controller FC, based on the pressure value measured by at least one of the pressure gauge P1 and the pressure gauge P2 (hereinafter, the flow rate of gas calculated by the control circuit CC is also referred to as "calculated flow rate"). Then, the control valve CV is controlled so that the difference between the calculated flow rate obtained by the control circuit CC and the set flow rate designated by the control unit Cnt to be described below is reduced.

In the exemplary embodiment, the flow rate controller FC has two control methods, one of the two control methods may be selected according to the pressure values measured by the pressure gauge P1 and the pressure gauge P2, and the calculated flow rate may be obtained according to the selected control method. Specifically, in a case where the critical expansion condition is satisfied, that is, in a case where the pressure in the gas line GL1 is set to be twice or more the pressure in the gas line GL2, the calculation flow rate is obtained from the pressure value in the gas line GL1 measured by the pressure gauge P1 of the flow rate controller FC, using the fact that gas is output at a constant speed (speed of sound) from the orifice OF in the flow rate controller FC. Such a control method is called proportional control. In a case where the flow rate controller FC is operating under the proportional control, the calculated flow rate $Q_c$ in the control circuit CC is obtained according to, for example, Expression (1).

[Expression 1]

$$Q_c = \frac{S \cdot C_1 \cdot P_i}{\sqrt{T}} \qquad (1)$$

In Expression (1), T is the temperature in the gas line GL1 or the gas line GL2. The temperature can be measured by a thermometer provided in the flow path of the flow rate controller FC, for example. In Expression (1), S and $C_1$ are coefficients, and $P_i$ is a pressure value on the primary side of orifice OF measured by the pressure gauge P1.

On the other hand, in a case where the critical expansion condition is not satisfied, that is, in a case where the pressure in the gas line GL1 is smaller than twice the pressure in the gas line GL2, the calculation flow rate is obtained using the pressure value in the gas line GL1 measured by the pressure gauge P1 and the pressure value in the gas line GL2 measured by the pressure gauge P2. Such a control method is called differential pressure control. In a case where the flow rate controller FC is operating under the differential pressure control, the calculation flow rate $Q_c$ in the control circuit CC is obtained according to, for example, Expression (2).

[Expression 2]

$$Q_c = \frac{S \cdot C_2 \cdot P_i}{\sqrt{T}} \cdot \sqrt{\left(\frac{P_o}{P_i}\right)^\alpha - \left(\frac{P_o}{P_i}\right)^\beta} \qquad (2)$$

In Expression (2), $C_2$ is a coefficient, and $P_o$ is a pressure value on the secondary side of the flow rate controller FC measured by the pressure gauge P2. In Expression (2), $\alpha$ and $\beta$ are predetermined constants.

The pipe 84 is connected to the gas supply pipe 82 downstream of the plurality of second valve V2 and valve VP2 and upstream of the third valve V3. A gas flow rate measurement mechanism 90 is provided in the pipe 84. The gas flow rate measurement mechanism 90 measures the flow rate of gas output from the plurality of flow rate controllers FC. The gas flow rate measurement mechanism 90 includes a fourth valve V4, a diaphragm mechanism 92, a tank 94, a fifth valve V5, and an exhaust device 96.

The fourth valve V4 is provided in the pipe 84 downstream of the plurality of second pipe L2. The diaphragm mechanism 92 is provided in the pipe 84 downstream of the fourth valve V4. That is, the diaphragm mechanism 92 is provided downstream of the second pipe L2. The diaphragm mechanism 92 is constituted by a valve whose opening degree can be adjusted, such as a variable orifice and a needle valve. The diaphragm mechanism 92 adjusts the flow rate of gas passing through the diaphragm mechanism 92 by adjusting the opening degree of the valve. This adjusts the pressure in the pipe upstream of the diaphragm mechanism 92, specifically, the pressure in the second pipe L2.

The tank 94 is provided in the pipe 84 downstream of the diaphragm mechanism 92. The tank 94 defines an internal space communicating with the flow path provided by the pipe 84. The tank 94 is provided with a pressure gauge P3 measuring the pressure in the tank 94 and a thermometer T3 measuring the temperature in the tank 94. An exhaust device 96 is provided through the fifth valve V5 downstream of the tank 94. The exhaust device 96 includes a vacuum pump such as a turbo molecular pump, and can depressurize the pressure in the pipe 84 to a predetermined degree of vacuum. In addition, in an exemplary embodiment, it may be configured such that the gas flow rate measurement mechanism 90 is connected to the exhaust device 50 through the pipe 84, instead of having the exhaust device 96 and the gas in the pipe 84 is exhausted by the exhaust device 50.

Referring to FIG. 2 again, the substrate processing apparatus 10 includes a first high-frequency power supply 62 and a second high-frequency power supply 64. The first high-frequency power supply 62 is connected to the lower electrode LE through a matching unit 66. The first high-frequency power supply 62 generates first high-frequency power for plasma generation and supplies the first high-frequency power to the lower electrode LE. The first high frequency power has a frequency of 27 to 100 MHz, for example, a frequency of 40 MHz. The matching unit 66 has a function of matching the output impedance of the first high-frequency power supply 62 and the input impedance on the load side (lower electrode LE side). The first high-frequency power supply 62 may be connected to the upper electrode 30 through the matching unit 66.

The second high-frequency power supply 64 is connected to the lower electrode LE through a matching unit 68. The second high-frequency power supply 64 generates a second high-frequency power for drawing ions into the wafer W, that is, the high-frequency bias power. The high frequency bias power has a frequency within the range of 400 kHz to 13.56 MHz, for example, a frequency of 13 MHz. The matching unit 68 has a function of matching the output impedance of the second high-frequency power supply 64 and the input impedance on the load side (lower electrode LE side).

The substrate processing apparatus 10 may further include a power supply 70. The power supply 70 is connected to the upper electrode 30. The power supply 70 is, for example, a DC power supply that generates a negative DC voltage, and applies to the upper electrode 30, a negative voltage for attracting positive ions present in the processing space S to the electrode plate 34 to the upper electrode 30. Note that the power supply 70 may apply a low frequency AC voltage to the upper electrode 30, instead of the negative DC voltage. The voltage applied to the upper electrode from the power supply 70 is a voltage of 150 V or more, for example. When a negative voltage is applied from the power supply 70 to the upper electrode 30, the positive ions present in the processing space S collide with the electrode plate 34. Thus, secondary electrons and/or silicon are emitted from the electrode plate 34. For example, the emitted silicon is bonded with active species of fluorine present in the processing space S to reduce the amount of active species of fluorine.

In an exemplary embodiment, the substrate processing apparatus 10 includes a control unit Cnt. The control unit Cnt is a computer including a processor, a storage unit, an input device, a display device, and the like, and controls each unit of the substrate processing apparatus 10. The control unit Cnt controls each part of the substrate processing apparatus 10 according to the recipe stored in the storage unit for substrate processing in the substrate processing apparatus 10. The control unit Cnt controls the flow rate controller and valve of the second gas supply system 80 in various exemplary embodiments of the method of obtaining the output flow rate of the flow rate controller. In various exemplary embodiments of the method, the control unit Cnt receives the pressure value measured by the pressure gauges P1, P2 and P3 and the temperature value measured by the thermometer T3, and calculates the output flow rate of the flow rate controller.

Hereinafter, FIG. 1 is referred to again. In the method MT1, the output flow rate of the flow rate controller FC1 is obtained using the measured values by the pressure gauge P3 and the thermometer T3 of the tank 94. That is, in the method MT1, one flow rate controller FC1 is the flow rate controller to be measured. In the method MT1, first, step ST1 is executed.

In step ST1, a set flow rate is determined. The set flow rate is determined, for example, according to the recipe stored in the storage unit of the control unit Cnt. In the subsequent step ST2, the supply of the gas of which flow rate is adjusted to the set flow rate by the flow rate controller FC1 is started. In the step ST2, the first valve V1 located upstream of the flow rate controller FC1 and the second valve V2 located downstream of the flow rate controller FC1 are opened, and the other first valves V1, the other second valves V2, the valve VP1, the valve VP2, and a plurality of valves VP4 are closed. In step ST1, the fourth valve V4 and the fifth valve V5 are opened, and the third valve V3 is closed. Further, in the step ST1, adjustment is made so that the opening degree of the diaphragm mechanism 92 is fully opened. Thus, gas from the gas source GS upstream of the flow rate controller FC1 is supplied into the tank 94 through the first pipe L1, the flow rate controller FC1, the second pipe L2, the gas supply pipe 82, and the pipe 84.

Next, step ST3 is executed. In step ST3, the exhaust device 96 is operated in a state where the supply of gas into the tank 94 started in step ST2 is continued. Thereby, the gas in the gas line GL2 of the flow rate controller FC1, the inside of the second pipe L2 downstream of the gas line GL2, the inside of the gas supply pipe 82 upstream of the third valve V3, the inside of the pipe 84, the inside of the tank 94, and the inside of the second pipe L2 downstream of the flow rate controller FC other than the flow rate controller FC1 and downstream of the second valve V2 is exhausted. In an exemplary embodiment, in the step ST3, the second pipe L2 can be depressurized so that the pressure of the gas line GL1 of the flow rate controller FC1 is twice or more the pressure of the gas line GL2 of the flow rate controller FC1. Thus, the flow rate controller FC1 controls the output flow rate by the proportional control.

In the subsequent step ST4, the measured pressure value of the pressure gauge P2 is monitored, in a state where the supply of gas into the tank 94 is continued. Then, after the measured pressure value of the pressure gauge P2 is stabilized, the fifth valve V5 is closed. In addition, for example, if the difference between the minimum value and the maximum value of the measured pressure value of the pressure gauge P2 within the predetermined time is equal to or less than the predetermined value, it can be determined that the measured pressure value of the pressure gauge P2 is stable. In the step ST4, the measured pressure value is sent to the control unit Cnt. In step ST4, monitoring of the measured pressure value may be executed by the control unit Cnt, and control of the fifth valve V5 may be executed by the control unit Cnt.

Figure 4:
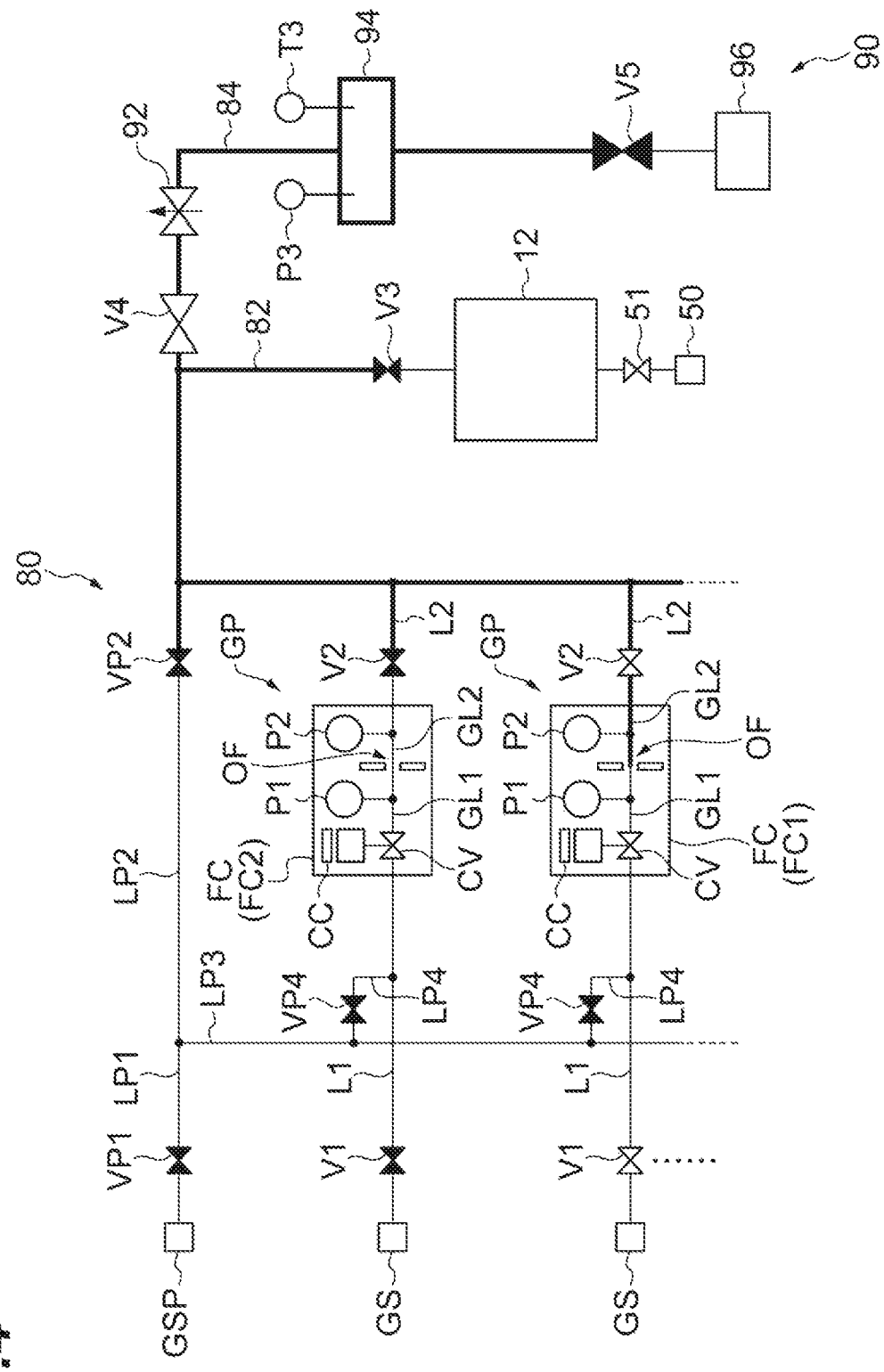
FIG. 4 is a diagram illustrating a state of a valve after execution of step ST4.

In step ST4, when the fifth valve V5 is closed, the state of each valve becomes the state shown in FIG. 4. In FIG. 4, figures colored in black among the figures showing the valves indicate closed valves, and figures colored in white among the figures showing the valve indicate opened valves.

After the execution of step ST4, the gas supplied through the flow rate controller FC1 is stored in the channel indicated by the bold line in FIG. 4. Specifically, the gas is stored in the gas line GL2 of the flow rate controller FC1, the inside of the second pipe L2 downstream of the gas line GL2, the inside of the gas supply pipe 82 upstream of the third valve V3, the inside of the pipe 84 upstream of the fifth valve V5, the inside of the tank 94, and the inside of the second pipe L2 downstream of the flow rate controller FC other than the flow rate controller FC1 and downstream of the second valve V2. The volume of the flow path including the tank 94 in which the gas is stored after the execution of step ST4 is the volume previously measured before the execution of the method MT1 and is the known volume Vk.

In the subsequent step ST5, the output flow rate of the flow rate controller FC1 is calculated. In the exemplary embodiment, in step ST5, the pressure rise amount per unit time ($dP_t/dt$) is obtained from the measured pressure value of the pressure gauge P3 at a plurality of time points after execution of step ST4. For example, the inclination of a straight line approximating a relationship between the plurality of measured pressure values and the time points when the plurality of measured pressure values are acquired is obtained as the pressure rise amount per unit time. Then, in step ST5, the output flow rate $Q_m$ of the flow rate controller FC1 is calculated by the following Expression (3). In Expression (3), T is a temperature measured in the flow path in which the above-described gas is stored, and can be measured by, for example, thermometer T3 of the tank 94. Further, R is constant.

[Expression 3]

$$Q_m = \frac{dP_t}{dt} \cdot \frac{Vk}{RT} \quad (3)$$

The output flow rate $Q_m$ calculated by Expression (3) is the flow rate of gas obtained based on the measured values of the pressure and temperature in the tank 94 which vary depending on gas when the gas is actually supplied into the tank 94 through the flow rate controller FC1. Therefore, it can be said that the output flow rate $Q_m$ is an estimated value of the output flow rate with a small error of the flow rate controller FC1 with respect to the actual flow rate. In step ST5, calculation of the output flow rate $Q_m$ can be performed by the control unit Cnt.

In the subsequent step ST6, the target pressure value in the second pipe L2 is determined. The target pressure value is a pressure value different from the pressure of the second pipe L2 set in step ST3. The target pressure value is a value previously stored in the storage unit of the control unit Cnt, for example. In the exemplary embodiment, the target pressure value may be set such that the pressure of the gas line GL1 of the flow rate controller FC1 is less than twice the target pressure value.

After the execution of step ST6, a sequence SQ1 is executed. The sequence SQ1 includes step ST7, step ST8, step ST9, step ST10, and step ST11. In step ST7, the fifth valve V5 is opened, and the exhaust device 96 is operated. Thus, the gas in the flow path in which the gas from the flow rate controller FC1 is stored is exhausted.

In the subsequent step ST8, the output of the gas of which flow rate is adjusted to the flow rate according to the set flow rate by the flow rate controller FC1 is started. In the step ST8, the same opening and closing states of the valves as when gas is supplied in step ST2 are made. That is, in the step ST8, the first valve V1 located upstream of the flow rate controller FC1 and the second valve V2 located downstream of the flow rate controller FC1 are opened, and the other first valves V1, the other second valves V2, the valve VP1, the valve VP2, and a plurality of valves VP4 are closed. In step ST8, the fourth valve V4 and the fifth valve V5 are opened, and the third valve V3 is closed. Thus, the gas from the gas source GS upstream of the flow rate controller FC1 is supplied into the tank 94 through the first pipe L1, the flow rate controller FC1, the second pipe L2, the gas supply pipe 82, and the pipe 84.

In the subsequent step ST9, the opening degree of the diaphragm mechanism 92 is adjusted so that the pressure on the downstream side of the flow rate controller FC1, that is, the pressure in the second pipe L2 is the target pressure value determined in step ST6. The pressure in the second pipe L2 is measured by, for example, the pressure gauge P2 of the flow rate controller FC1. In a case where the target pressure value is set so that the pressure of the gas line GL1 of the flow rate controller FC1 is less than twice the target pressure value in step ST6, the flow rate controller FC1 controls the output flow rate by the differential pressure control.

In the subsequent step ST10, the measured pressure value of the pressure gauge P2 is monitored, in a state where the supply of gas into the tank 94 is continued. Then, after the pressure in the second pipe L2 reaches the target pressure value, the fifth valve V5 is closed. In the step ST10, monitoring of the measured pressure value may be executed by the control unit Cnt, and control of the fifth valve V5 may be executed by the control unit Cnt.

In the subsequent step ST11, the output flow rate $Q_m$ of the flow rate controller FC1 is calculated. The calculation method of the output flow rate $Q_m$ is the same as the calculation method of the output flow rate $Q_m$ in step ST5. That is, the pressure rise amount per unit time ($dP_t/dt$) is obtained from the measured pressure value of the pressure gauge P3 at a plurality of time points after execution of step ST10. Then, the output flow rate $Q_m$ of the flow rate controller FC1 is calculated by the calculation of the above-described Expression (3). The calculated output flow rate $Q_m$ can be stored in the storage unit of the control unit Cnt.

In the subsequent step ST12, it is determined whether or not the calculation of the output flow rate $Q_m$ is completed for all the target pressure values. In the exemplary embodiment, one or more target pressure values to be set are stored in the storage unit of the control unit Cnt. In step ST12, the control unit Cnt determines whether or not calculation of the output flow rate $Q_m$ is completed for all of the one or more target pressure values stored in the storage unit. In a case where it is determined in step ST12 that calculation of the output flow rate $Q_m$ is not completed for all of the target pressure values, the target pressure value is changed to the other target pressure value in the subsequent step ST13. The sequence SQ1 is repeated until the calculation of the output flow rate $Q_m$ is completed for all the target pressure values. Thus, it is possible to recognize the output flow rate of the flow rate controller FC1 when the pressure value in the second pipe L2 is set to the target pressure value.

In the method MT1, the output flow rate $Q_m$ of the flow rate controller FC1 is calculated based on the pressure and temperature in the tank 94 after the pressure in the second pipe L2 is adjusted to the target pressure value, such that it is possible to calculate the output flow rate $Q_m$ of both flow rate controllers FC1 in a case where the critical expansion condition is satisfied and in a case where the critical expansion condition is not satisfied by changing the target pressure. Therefore, it is possible to calculate the output flow rate $Q_m$ of the flow rate controller FC1 operating in both control methods by changing the target pressure.

In the exemplary embodiment, step ST14 may be performed after it is determined that the calculation of the output flow rate $Q_m$ is completed for all of the target pressure values in step ST12. In step ST14, calibration data is generated after the sequence SQ1 is repeatedly executed while changing the target pressure value to a plurality of pressure values. The calibration data is data defining the relationship between the plurality of pressure values and the output flow rate $Q_m$ of the flow rate controller FC1 calculated in step ST5 or step ST11. The calibration data can be arbitrary data as long as it defines the relationship between a plurality of pressure values and the output flow rate $Q_m$ of the flow rate controller FC1. For example, the calibration data may be tabular data in which the plurality of pressure values and the output flow rate $Q_m$ are associated with each other. The calibration data may be data expressing the output flow rate $Q_m$ of the flow rate controller FC1 as a function with the pressure value in the second pipe L2 as a variable. Further, the calibration data may be a coefficient corresponding to the secondary pressure used for calculating the output flow rate in the flow rate controller FC1.

Figure 5:
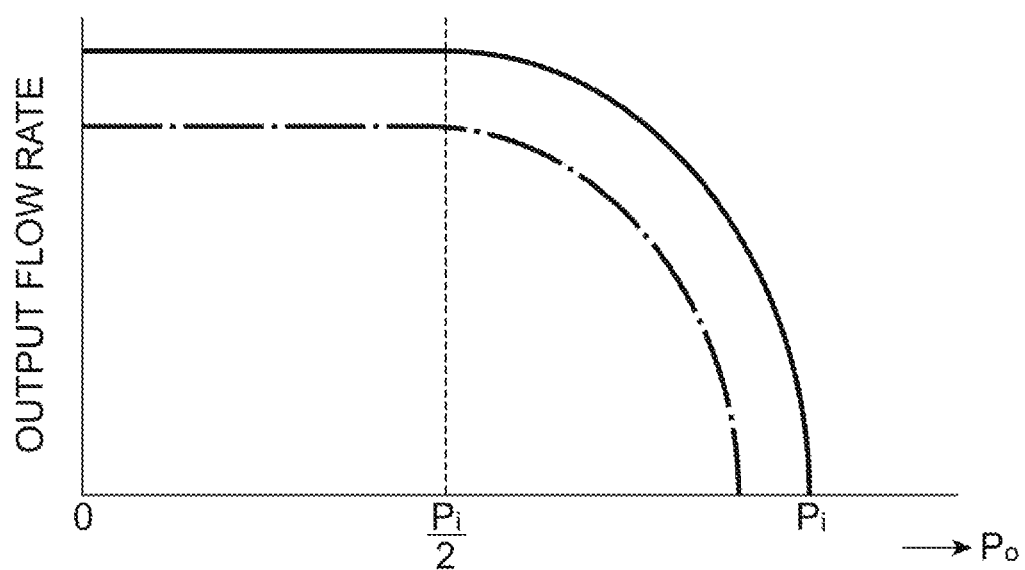
FIG. 5 is a graph illustrating a relationship between a pressure in a second pipe and the output flow rate of the flow rate controller.

With reference to FIG. 5, an example of the calibration data generation method in the case where the calibration data is a coefficient corresponding to the secondary pressure used for calculating the output flow rate in the flow rate controller FC1 will be described. FIG. 5 is a graph showing an example of the relationship between the pressure value in the second pipe L2 located downstream of the flow rate controller FC1 and the output flow rate of the flow rate controller FC1. The graph indicated by the solid line in FIG. 5 shows a relationship between the calculation flow rate $Q_c$ of the flow rate controller FC1 which is calculated according to the above Expression (1) or (2) by the control circuit CC of the flow rate controller FC1 and the pressure value $P_o$ in the second pipe L2. In a case where the pressure of the gas line GL1 of the flow rate controller FC1 is twice or more the pressure of the gas line GL2 of the flow rate controller FC1, that is, in a case where $P_o$ is $P_i/2$ or less, the control circuit CC obtains the calculation flow rate $Q_c$ of the flow rate controller FC1 according to Expression (1). On the other hand, in a case where the pressure of the gas line GL1 of the flow rate controller FC1 is smaller than twice the pressure of the gas line GL2 of the flow rate controller FC1, that is, in a case where $P_o$ is larger than $P_i/2$, the control circuit CC obtains the calculation flow rate $Q_c$ of the flow rate controller FC1 according to Expression (2).

In step ST14, the values of the coefficient $C_1$ in Expression (1) and the coefficient $C_2$ in Expression (2) are adjusted such that a difference between an output flow rate $Q_m$ which is obtain by repeatedly executing the sequence SQ1 while changing the target pressure value to a plurality of pressure values and a calculation flow rate $Q_c$ obtained using the above Expression (1) or Expression (2) is minimized. The graph indicated by the dash-dotted line in FIG. 5 shows a relationship between the calculation flow rate $Q_G$ of the flow rate controller FC1 which is calculated according to Expression (1) or Expression (2) in which the coefficient $C_1$ and the coefficient $C_2$ are adjusted and the pressure value $P_o$ in the second pipe L2. In this manner, it is possible to suppress the difference between the actual flow rate and the calculation flow rate of the flow rate controller FC1 by obtaining the calculation flow rate $Q_c$ according to Expression (1) or Expression (2) in which the coefficient $C_1$ and the coefficient $C_2$ are adjusted. In this example, the coefficient $C_1$ and the coefficient $C_2$ which are adjusted in this way are calibration data for defining the relationship between a plurality of pressure values and the output flow rate of the flow rate controller FC. That is, it is possible to obtain the output flow rate of the flow rate controller FC1 according to the pressure value $P_o$ in the second pipe L2, by using Expression (1) or Expression (2) in which the coefficient $C_1$ and the coefficient $C_2$ are adjusted. The calibration data which is generated as described above is stored in, for example, the storage unit of the control unit Cnt.

Figure 6:
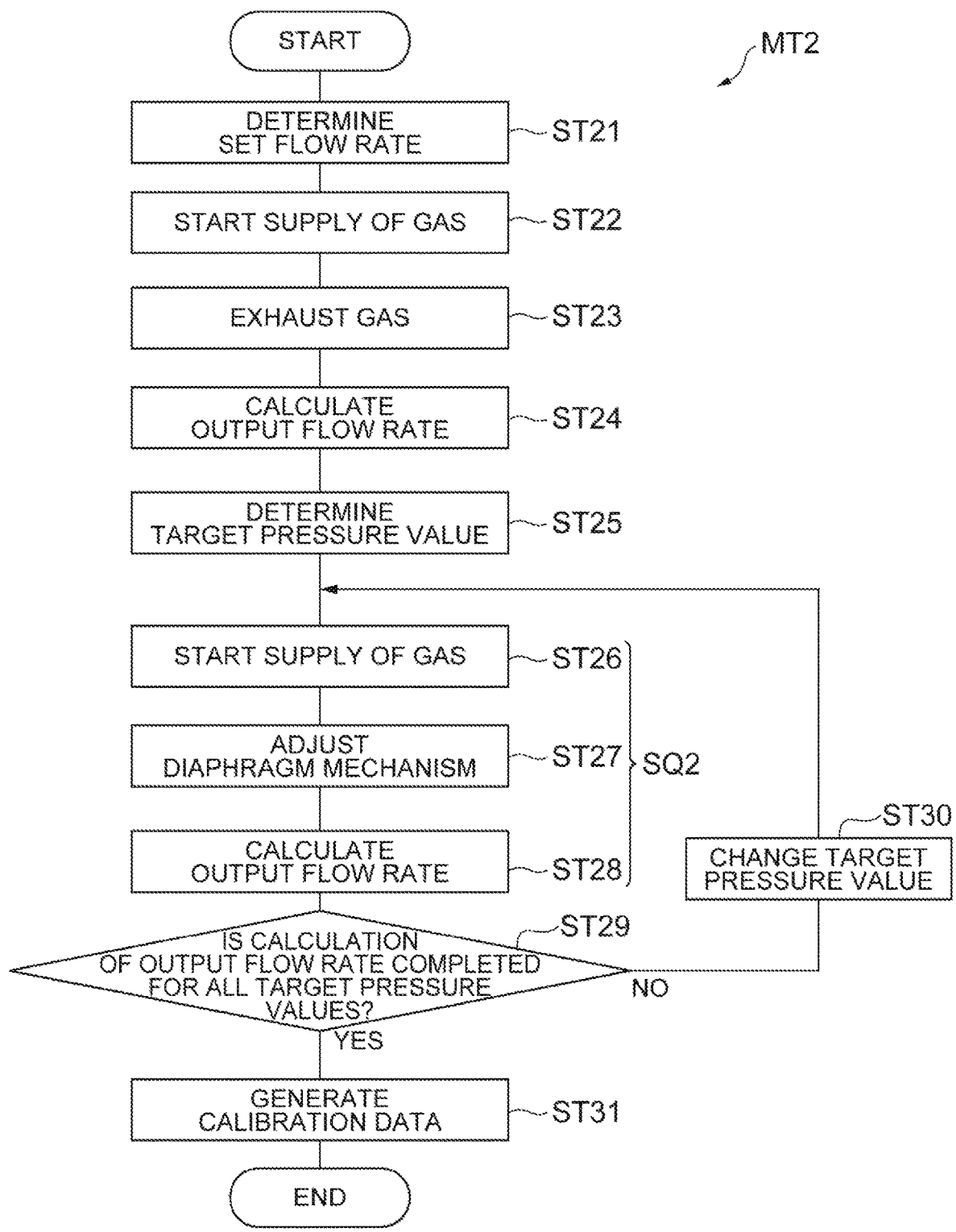
FIG. 6 is a flow diagram illustrating a method of obtaining an output flow rate of a flow rate controller according to another exemplary embodiment.
Figure 7:
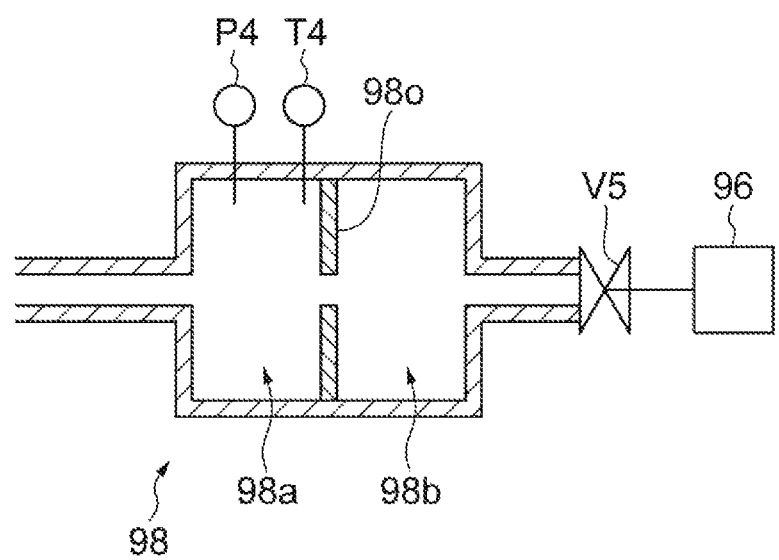
FIG. 7 is a vertical cross-sectional view schematically illustrating a tank according to a modification example.

Next, with reference to FIG. 6, a method of obtaining an output flow rate of a flow rate controller according to another exemplary embodiment will be described. Hereinafter, the differences from the method MT1 shown in FIG. 1 will be mainly described, and redundant explanation will be omitted. FIG. 6 is a flow diagram illustrating a method MT2 of obtaining an output flow rate of a flow rate controller according to another exemplary embodiment. The method MT 2 is applied to a substrate processing apparatus including a tank 98 instead of the tank 94. FIG. 7 is a vertical cross-sectional view schematically illustrating the tank 98. The tank 98 is a so-called sonic nozzle, and has an internal space including a first space 98a and a second space 98b. In the first space 98a, a pressure gauge P4 which measures the pressure value in the first space 98a and a thermometer T4 which measures a temperature value in the first space 98a are provided. The second space 98b is provided on the downstream side of the first space 98a. An orifice 98o is interposed between the first space 98a and the second space 98b, and the first space 98a and the second space 98b are connected to each other by the orifice 98o.

As shown in FIG. 6, the method MT2 includes step ST21 to step ST31. The step ST21 to step ST31 are the same as or correspond to step ST1 to step ST3, step ST5, step ST6, step ST8, step ST9 and step ST11 to step ST14 of the method MT1. That is, the method MT2 is different from the method MT1 in that step ST4, step ST7 and step ST10 shown in FIG. 1 are not executed. In the method MT2, the output flow rate of the flow rate controller FC1 is calculated in a state where the fifth valve is opened and the exhaust device 96 is operated.

Specifically, in step ST23, the second space 98b of the tank 98 and the pipe 84 on the downstream side of the tank 98 are depressurized by the exhaust device 96 being operated. Thus, the pressure value in the first space 98a is set to be larger than twice the pressure value in the second space 98b. In the subsequent step ST24, the supply of gas to the tank 98 is continued, and the pressure value and the temperature value in the first space 98a are acquired in a state where the exhaust device 96 is operated. The pressure value and the temperature value can be acquired using the pressure gauge P4 and thermometer T4 provided in the first space 98a.

In the subsequent step ST24, the output flow rate $Q_m$ of the flow rate controller FC1 is calculated. Since the pressure value in the first space 98a is set to be larger than twice the pressure value in the second space 98b, the gas supplied to the tank 98 passes through the orifice 98o at the speed of sound. In step ST24, using the fact that the gas passing through the orifice 98O has a constant speed, the output flow rate $Q_m$ of the flow rate controller FC1 is calculated by the following Expression (4). In the following Expression (4), K is a constant, $P_t$ is a pressure value in the first space 98a, and T is a temperature value in the first space 98a.

[Expression 4]

$$Q_m = \frac{K \cdot P_t}{\sqrt{T}} \quad (4)$$

In the method MT2, also in step ST28, similarly to step ST24, in a state where supply of gas to the tank 98 is continued and the exhaust device 96 is operated, the output flow rate $Q_m$ of the flow rate controller FC1 is calculated by the calculation of Expression (4). In the method MT 2, it is possible to calculate the output flow rate $Q_m$ of the flow rate controller FC1 without using the volume in the flow path in which gas from the flow rate controller FC1 is stored. The sequence SQ2 including step ST26, step ST27, and step ST28 is repeated until the calculation of the output flow rate $Q_m$ is completed for all the target pressure values. Thus, the output flow rate $Q_m$ of the flow rate controller when the pressure value in the second pipe L2 is set to a plurality of pressure values is obtained.

Next, a method of processing a workpiece using a substrate processing apparatus according to one exemplary embodiment will be described. Hereinafter, a method of processing a workpiece using the substrate processing apparatus 10 shown in FIG. 2 will be described, but this method can be applied to any substrate processing apparatus.

FIG. 8 is a flow diagram illustrating a method of processing a workpiece according to an exemplary embodiment. The method MT3 shown in FIG. 8 is a method of calibrating the output flow rate of the flow rate controller using calibration data and processing a workpiece using the gas output at the calibrated flow rate. In the following, as an example of a processing method of a workpiece, a method of forming a silicon oxide film on a resist pattern of a wafer W will be described. In the method MT3, first, step ST41 is executed.

In step ST41, the wafer W is loaded into the chamber 12c through the loading and unloading port 12g. A resist pattern is formed on the wafer W. The wafer W loaded into the chamber 12c is supported on the stage ST. In the subsequent step ST42, the exhaust device 50 is operated and the pressure regulating valve 51 adjusts the pressure in the chamber 12c to the set pressure. The set pressure is determined, for example, according to the recipe stored in the storage unit of the control unit Cnt.

In the subsequent step ST43, one flow rate controller to be calibrated out of the plurality of flow rate controllers FC is selected. In the following description, it is assumed that one flow rate controller FC1 is a flow rate controller to be calibrated. In the subsequent step ST44, the calibration data corresponding to the flow rate controller FC1 is selected. The calibration data may be generated for each flow rate controller by the above method MT1 or MT2 and stored in, for example, the storage unit of the control unit Cnt.

In the subsequent step ST45, the output flow rate of the flow rate controller FC1 is obtained using the selected calibration data. For example, in step ST45, the output flow rate of the flow rate controller FC1 corresponding to the pressure value in the second pipe L2 located downstream of the flow rate controller FC1 is obtained using Equation (1) or Equation (2) in which the coefficient $C_1$ and the coefficient $C_2$ are adjusted. The pressure in the second pipe L2 is obtained from the measured value of the pressure gauge P2 of the flow rate controller FC1. In a case where the pressure in the chamber 12c is equal to the pressure in the second pipe L2, the pressure in the second pipe L2 may be obtained by the pressure gauge provided in the chamber 12c. Further, the set pressure designated in step ST42 may be used as the pressure in the second pipe L2.

In the subsequent step ST46, gas is supplied into the chamber 12c from the first gas supply system 40 and the second gas supply system 80. Specifically, purge gas is supplied into the chamber 12c from the first gas supply system 40, and precursor gas is supplied into the chamber 12c from the second gas supply system 80. This precursor gas is, for example, aminosilane gas. By supplying aminosilane gas into the chamber 12c from the second gas supply system 80, the aminosilane gas is adsorbed on the resist pattern of the wafer W. In step ST46, the flow rate controller FC1 of the second gas supply system 80 controls the control valve CV so that the error of the output flow rate obtained in step ST45, that is, the calibrated output flow rate with respect to the set flow rate decreases. This makes it possible to supply aminosilane gas at a flow rate corresponding to the flow rate designated in recipe to the processing space S, so that a desired amount of aminosilane gas can be adsorbed on the resist pattern of the wafer W. Since purge gas is supplied from the first gas supply system 40, formation of a by-product derived from aminosilane gas in the gas supply pipe 38 is prevented. Thereafter, in step ST47, the supply of gas from the first gas supply system 40 and the second gas supply system 80 is stopped.

In the subsequent step ST48, gas is supplied into the chamber 12c from the first gas supply system 40 and the second gas supply system 80. In step ST48, the process gas whose flow rate has been adjusted by the flow rate controller group 43 from the first gas supply system 40 is supplied into the chamber 12c. This process gas is, for example, oxygen gas. In step ST48, purge gas is supplied into the chamber 12c from the second gas supply system 80. By supplying the purge gas from the second gas supply system 80 in this manner, formation of a by-product derived from aminosilane gas in the gas supply pipe 82 is prevented.

In the subsequent step ST49, plasma of the oxygen gas supplied into the chamber 12c in step ST48 is generated. Since the plasma of oxygen gas is generated, the aminosilane gas reacts with the oxygen gas, and a silicon oxide film is formed on the resist pattern. Thereafter, in step ST50, the supply of gas from the first gas supply system 40 and the second gas supply system 80 is stopped.

In the subsequent step ST51, it is determined whether or not the termination condition is satisfied. For example, a sequence including step ST46 to step ST50 is repeated a predetermined number of times, so it is determined that the termination condition is satisfied. In a case where it is determined in step ST51 that the termination condition is not satisfied, the sequence is repeated until the termination condition is satisfied. Thus, a silicon oxide film having a desired film thickness is formed on the wafer W.

In the method MT 3, the flow rate controller FC1 is controlled so that the output flow rate of the flow rate controller FC1 is calibrated based on the calibration data and the error of the calibrated output flow rate decreases with respect to the set flow rate. As a result, it is possible to supply the precursor gas at an appropriate flow rate according to the set flow rate from the flow rate controller FC1 into the chamber 12c. Therefore, according to the method MT3, it is possible to form a silicon oxide film having an appropriate film thickness on the wafer W.

Although the method of obtaining the output flow rate of the flow rate controller and the method of processing the workpiece according to the various exemplary embodiments have been described above, the present invention is not limited to the above-described exemplary embodiments, and various modifications can be configured within the scope without changing the gist of the invention. For example, the flow rate controller FC is a pressure type flow rate controller, but the flow rate controller FC may be a thermal type mass flow rate controller. In a case where the mass flow rate controller does not include a pressure gauge measuring the pressure on the downstream side, another pressure gauge may be provided in the second pipe L2 located downstream of the mass flow controller.

In the above-described exemplary embodiments, the method of obtaining the output flow rate of the flow rate controller FC of the second gas supply system 80 has been described, but this method can also be applied to the flow rate controller group 43 of the first gas supply system 40. In the exemplary embodiment described above, the method MT1 is executed for the flow rate controller FC1, but the method MT1 may be executed sequentially for all the flow rate controllers FC.

In the method MT1 shown in FIG. 1, the target pressure value in the second pipe L2 located downstream of the flow rate controller FC is changed to a plurality of pressure values to obtain the output flow rate of the flow rate controller FC1, but the pressure in the second pipe L2 may be set to at least one target pressure value to obtain the output flow rate of the flow rate controller FC1 at that time.

Further, although the substrate processing apparatus 10 shown in FIG. 2 includes one second gas supply system 80, it may include a plurality of second gas supply systems 80 in an exemplary embodiment. For example, it may be configured such that the substrate processing apparatus 10 includes a plurality of second gas supply system 80 and the plurality of second gas supply systems 80 supplies gas to the processing space S from the radiation direction of the axis line Z. In this case, it is possible to supply gas at a uniform flow rate from the radiation direction of the axis line Z to the processing space S by calibrating the output flow rate of the plurality of second gas supply systems 80 by the method MT3. Thus, the in-plane uniformity of the wafer W can be improved.

What is claimed is:

1. A method of obtaining an output flow rate of a gas supply unit,
   wherein the gas supply unit includes
      a first pipe connected to a gas source,
      a flow rate controller provided downstream of the first pipe, and
      a second pipe provided downstream of the flow rate controller,
   wherein the flow rate controller includes an orifice, a first gas line located on an upstream side of the orifice and connected to the first pipe, and a second gas line located on a downstream side of the orifice and connected to the second pipe,
   wherein a first valve capable of adjusting a pressure in the second pipe is provided downstream of the second pipe, and
   wherein a tank is provided downstream of the first valve, the method comprising:
   outputting gas from the flow rate controller at an adjusted flow rate that is adjusted according to a designated set flow rate, in a state where the first valve is opened;
   depressurizing the second pipe so that a pressure of the first gas line becomes twice or more the pressure of the second gas line;
   obtaining a first output flow rate of the flow rate controller by using a pressure value and a temperature value in the tank;
   adjusting the first valve so that the pressure in the second pipe is a target pressure value, in a state where the outputting of the gas from the flow rate controller is continued, the target pressure value being set such that the pressure of the first gas line is less than twice the target pressure value; and
   obtaining a second output flow rate of the flow rate controller by using a pressure value and a temperature value in the tank, after the pressure in the second pipe is set to the target pressure value.

2. The method according to claim 1,
   wherein a second valve is provided downstream of the tank,
   wherein the method further comprises:
   opening the second valve while outputting the gas from the flow rate controller at the adjusted flow rate;
   closing the second valve after the pressure in the second pipe is set to the target pressure value; and
   after the second valve is closed, obtaining the second output flow rate of the flow rate controller from a known volume of a flow path including the tank in which gas supplied through the flow rate controller is stored, a temperature value in the tank and a rise amount of a pressure value in the tank per unit time.

3. The method according to claim 2, wherein an exhaust device is provided downstream of the tank via the second valve.

4. The method according to claim 1,
   the internal space of the tank includes a first space and a second space provided downstream of the first space, and the first space and the second space are connected to each other through an orifice such that a pressure in the first space is twice or more a pressure in the second space, and
   wherein the second output flow rate of the flow rate controller is obtained from a pressure value and a temperature value in the first space.

5. The method according to claim 1, further comprising:
   obtaining calibration data for defining a relationship between a plurality of pressure values and the second output flow rate of the flow rate controller by repeating a sequence including the outputting gas, the adjusting the first valve, and the obtaining of the second output flow rate, while changing the target pressure value to the plurality of pressure values, wherein the plurality of pressure values are different from each other.

6. The method according to claim 1,
   wherein the flow rate controller is a pressure type flow rate controller.

7. The method according to claim 1, wherein
   a gas supply system including the gas supply unit further includes another gas supply unit,
   the other gas supply unit includes
      another first pipe connected to another gas source,
      another flow rate controller provided downstream of the other first pipe, and
      another second pipe provided downstream of the other flow rate controller, and
   the first valve is provided downstream of the second pipe and the other second pipe.

8. The method according to claim 1, wherein the first valve is adjusted so that the pressure in the second pipe is one pressure value as the target pressure value, the second output flow rate of the flow rate controller is obtained by using a pressure value and a temperature value in the tank, after the pressure in the second pipe is set to the one pressure value, and the method further comprises obtaining calibration data for defining a relationship between the one pressure value and the second output flow rate of the flow rate controller.

9. The method according to claim 1, wherein the tank comprises a pressure gauge to measure pressure inside of the tank and a thermometer to measure temperature inside of the tank.

* * * * *